United States Patent [19]
Dapper et al.

[11] Patent Number: 5,930,687
[45] Date of Patent: Jul. 27, 1999

[54] APPARATUS AND METHOD FOR GENERATING AN AM-COMPATIBLE DIGITAL BROADCAST WAVEFORM

[75] Inventors: Mark J. Dapper, Cincinnati; Michael J. Geile, Loveland; Barry Walter Carlin, Greenhills, all of Ohio

[73] Assignee: USA Digital Radio Partners, L.P., Columbia, Md.

[21] Appl. No.: 08/724,606

[22] Filed: Sep. 30, 1996

[51] Int. Cl.⁶ ................................................. H03C 1/52
[52] U.S. Cl. ........................... 455/108; 455/45; 455/118; 332/151; 375/216
[58] Field of Search ..................... 455/108, 110, 455/303, 45, 118, 109; 375/216, 260, 261, 279, 298, 308, 329, 340; 348/471; 332/151, 155, 103, 115

[56] References Cited

U.S. PATENT DOCUMENTS

| | | | |
|---|---|---|---|
| 3,749,843 | 7/1973 | Roycraft et al. | 332/151 |
| 4,143,322 | 3/1979 | Shimamura | 325/320 |
| 4,255,713 | 3/1981 | Yoshida | 329/50 |
| 4,318,049 | 3/1982 | Mogensen | 329/50 |
| 4,466,108 | 8/1984 | Rhodes | 375/83 |
| 4,484,337 | 11/1984 | Leclert et al. | 375/81 |
| 4,550,415 | 10/1985 | Debus, Jr. et al. | 375/14 |
| 4,584,541 | 4/1986 | Nossen | 455/108 |
| 4,660,222 | 4/1987 | Smith | 455/109 |
| 4,686,705 | 8/1987 | Smith | 455/109 |
| 4,787,096 | 11/1988 | Wong | 375/120 |
| 4,795,986 | 1/1989 | Ceroni et al. | 329/124 |
| 4,843,583 | 6/1989 | White et al. | 364/724 |
| 4,847,797 | 7/1989 | Picchi et al. | 364/602 |
| 4,879,728 | 11/1989 | Tarallo | 375/80 |
| 5,019,824 | 5/1991 | Kumar | 342/195 |
| 5,113,142 | 5/1992 | Yoshikawa | 329/306 |
| 5,148,451 | 9/1992 | Otani et al. | 375/97 |
| 5,175,747 | 12/1992 | Murakami | 375/19 |
| 5,175,877 | 12/1992 | Streeter | 455/102 |
| 5,214,671 | 5/1993 | Nakai | 375/14 |
| 5,214,674 | 5/1993 | Sayegh | 375/97 |
| 5,237,286 | 8/1993 | Kimura et al. | 332/151 |
| 5,243,624 | 9/1993 | Paik et al. | 375/14 |
| 5,247,543 | 9/1993 | Tsuda et al. | 375/97 |
| 5,268,930 | 12/1993 | Sendyk et al. | 375/13 |
| 5,410,280 | 4/1995 | Linguet et al. | 332/151 |
| 5,430,711 | 7/1995 | Yamada et al. | 370/20 |
| 5,448,590 | 9/1995 | Kostic | 375/232 |
| 5,534,828 | 7/1996 | Okada et al. | 332/103 |
| 5,535,245 | 7/1996 | Kim | 345/261 |
| 5,588,022 | 12/1996 | Dapper et al. | 375/216 |
| 5,617,063 | 4/1997 | Chaplik | 455/110 |
| 5,642,397 | 6/1997 | Agbaje-Anozie | 455/13.3 |

*Primary Examiner*—Reinhard J. Eisenzopf
*Assistant Examiner*—Darnell R. Armstrong
*Attorney, Agent, or Firm*—Robert P. Lenart

[57] ABSTRACT

An apparatus and method for generating a broadcast waveform is provided which, for generating an in-phase component, includes an in-phase digital signal generator; a first filter for filtering the in-phase digital signal; a first digital-to-analog converter for converting the filtered digital signal into a first analog signal; an AM baseband signal generator producing an AM baseband signal; a first summer for summing the first analog and AM baseband signals to produce a composite analog signal; and a first modulator for modulating the composite analog signal with a first carrier signal at a transmission frequency, thus producing a first modulated signal. To provide the quadrature component of the broadcast waveform, the waveform generator includes a quadrature digital signal generator producing a quadrature digital signal; a second digital-to-analog converter for converting the quadrature digital signal into a second analog signal; a second modulator for modulating the second baseband signal with a second carrier signal; and a second summer for summing the first and second modulated signals, thus producing the broadcast waveform. The apparatus improves the signal-to-noise ratio in analog AM receivers, especially at higher frequencies.

42 Claims, 6 Drawing Sheets

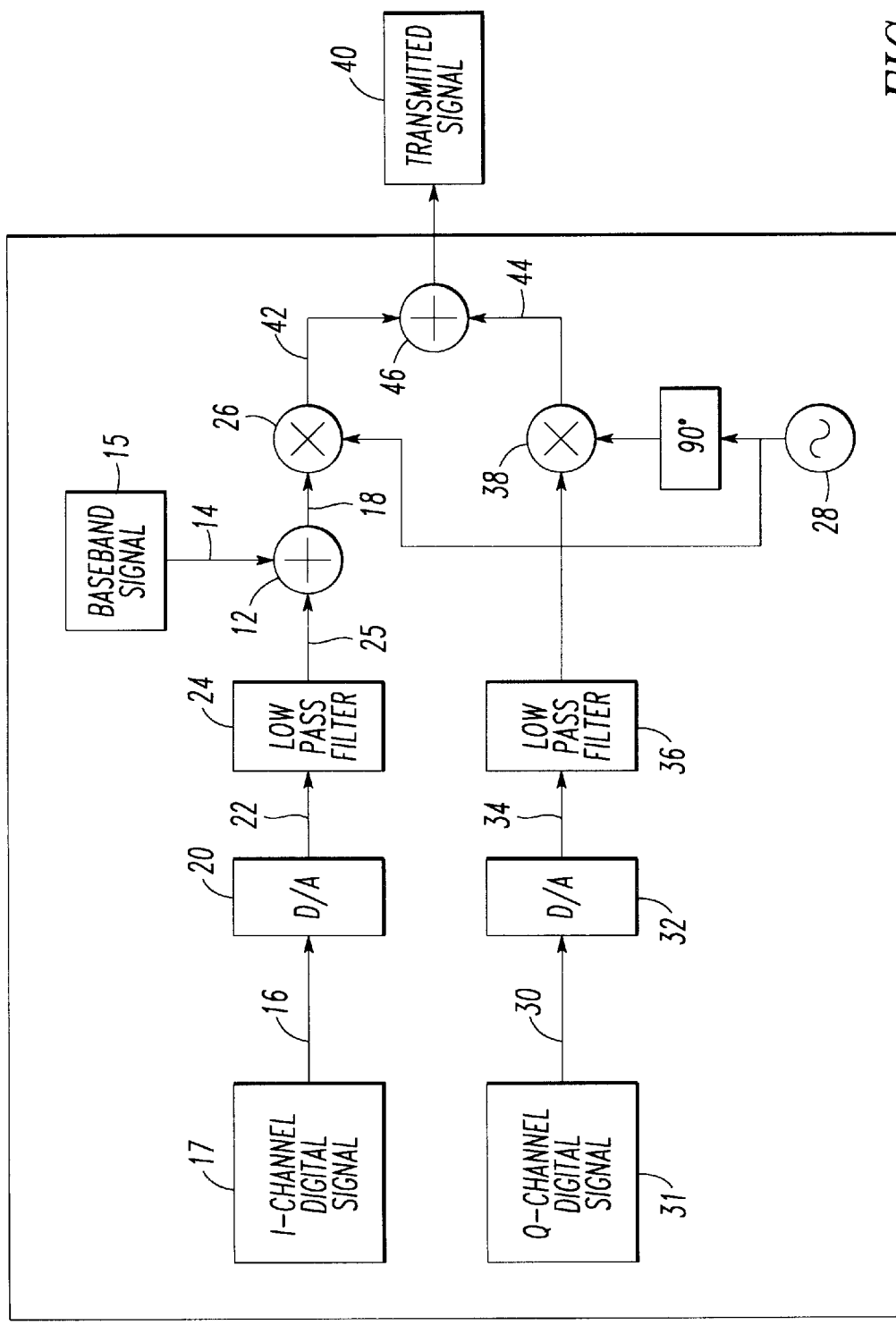

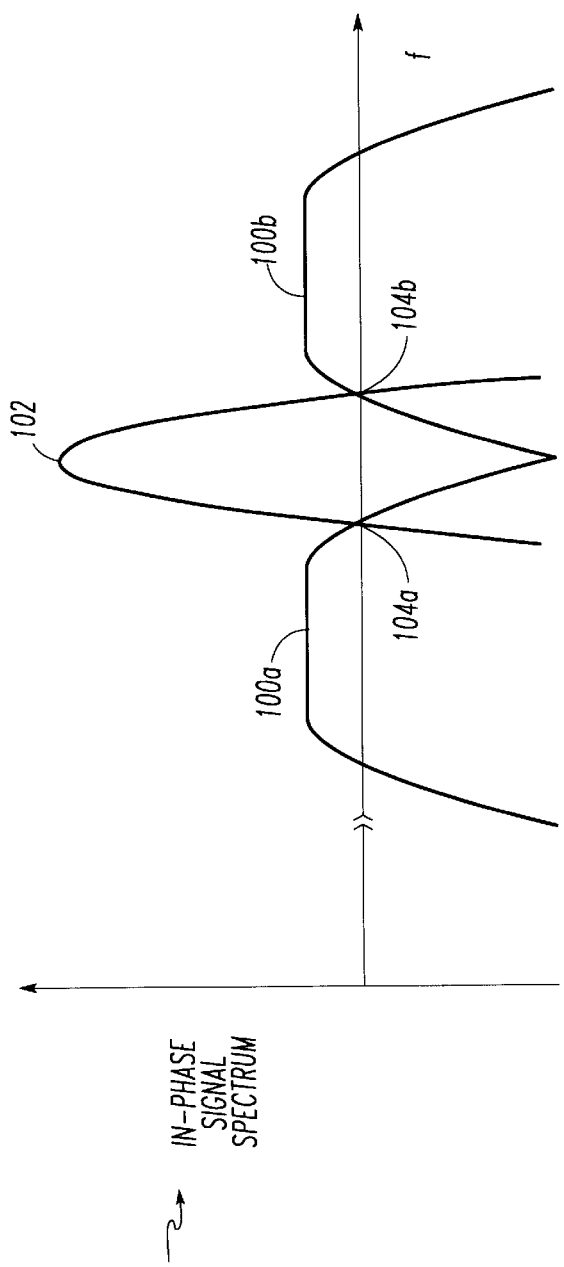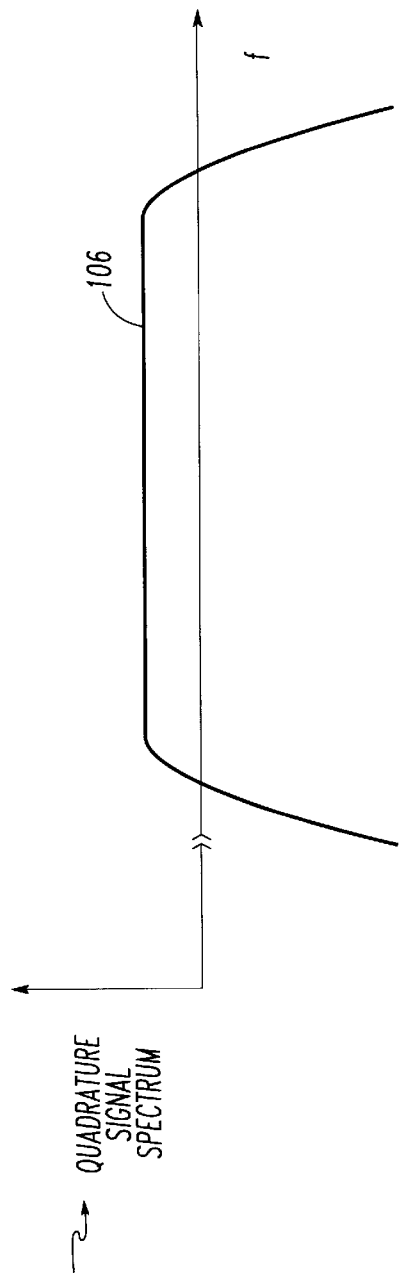

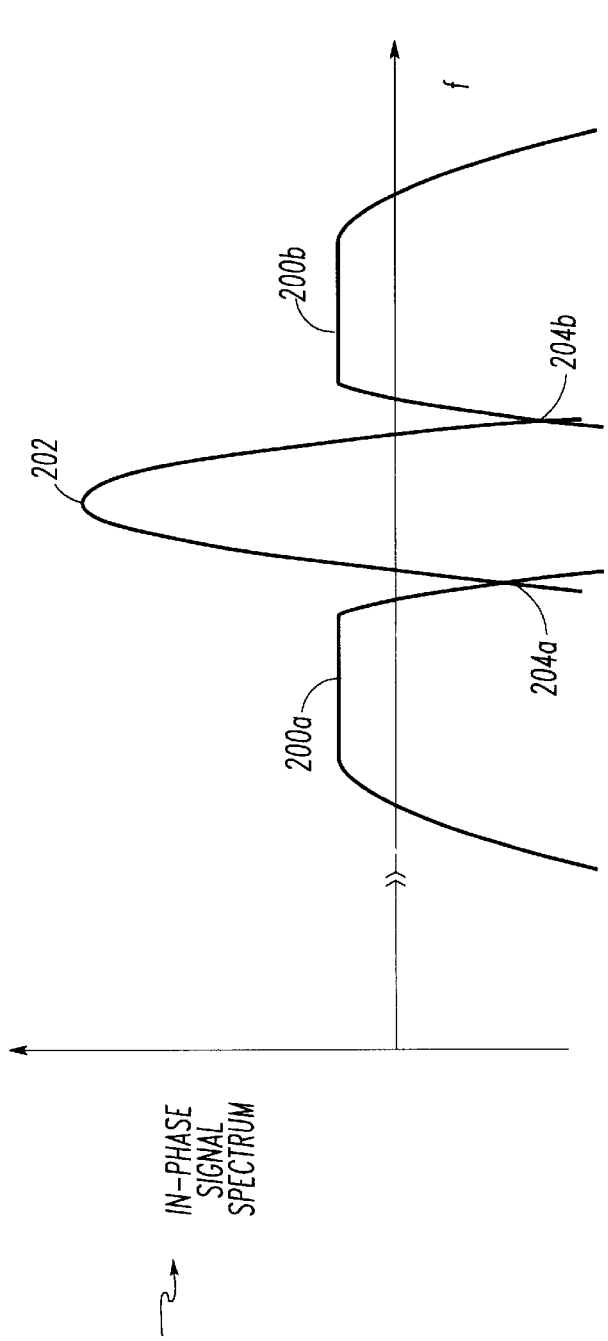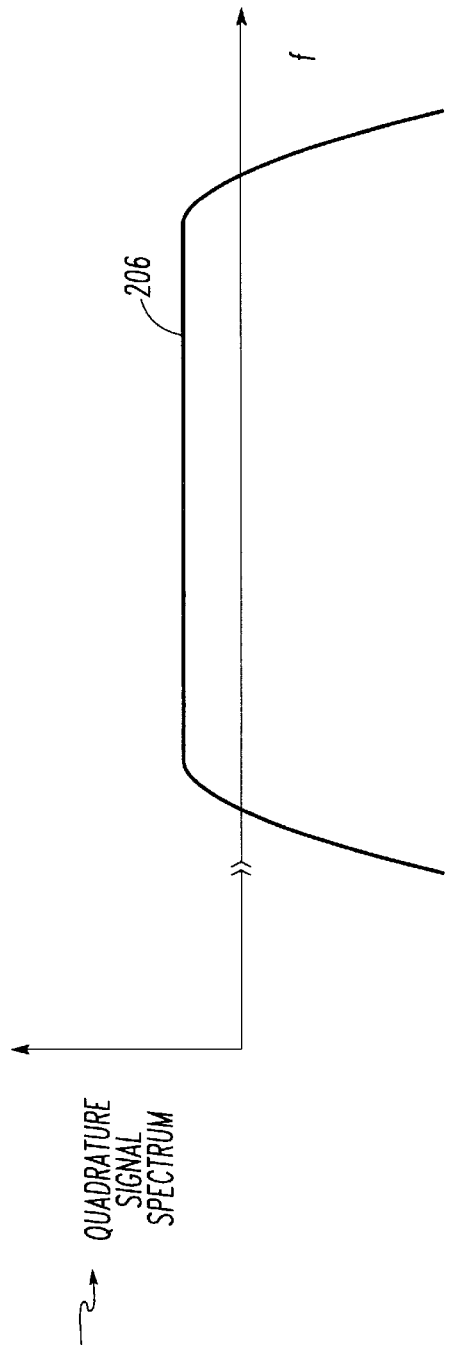

APPARATUS AND METHOD FOR GENERATING AN AM-COMPATIBLE DIGITAL BROADCAST WAVEFORM

BACKGROUND OF THE INVENTION

1. Field of the Invention

This invention relates to radio broadcasting and, more particularly, to a method of and apparatus for recovering an underlying digital broadcast signal from an amplitude-modulated broadcast carrier and for improving the signal-to-noise ratio in analog amplitude modulated receivers, especially at higher audio frequencies.

2. Description of the Related Art

There has been increasing interest in the possibility of broadcasting digitally encoded audio signals to provide improved audio fidelity. Several approaches have been suggested. One such approach, set forth in U.S. Pat. No. 5,588,022, which is assigned to the assignee hereof, and which is incorporated herein by reference, teaches a method for simultaneously broadcasting analog and digital signals in a standard AM broadcasting channel. An amplitude-modulated (AM) radio frequency (RF) signal having a first frequency spectrum is broadcast. The amplitude modulated radio frequency signal includes a first carrier modulated by an analog program signal. Simultaneously, a plurality of digitally-modulated carrier signals are broadcast within a bandwidth which encompasses the first frequency spectrum. Each of the digitally-modulated carrier signals is modulated by a portion of a digital program signal. A first group of the digitally-modulated carrier signals lies within the first frequency spectrum and is modulated in quadrature with the first carrier signal. Second and third groups of the digitally-modulated carrier signals lie outside of the first frequency spectrum and are modulated both in-phase and in-quadrature with the first carrier signal. Both transmitters and receivers are provided in accordance with that method.

The waveform in the AM compatible digital audio broadcasting system described in the above referenced U.S. Pat. No. 5,588,022, has been formulated to provide optimal data throughput for the digital signal while avoiding cross-talk into the analog AM channel. Multiple carriers are employed by means of orthogonal frequency division multiplexing (OFDM) to bear the communicated information.

SUMMARY OF THE INVENTION

The invention provides an apparatus and method for generating an AM-compatible digital broadcast waveform and for improving the signal-to-noise ratio in the analog AM receivers, especially at higher audio frequencies. The waveform generating apparatus can include an in-phase digital signal generator producing an in-phase digital signal; a high-pass filter for filtering the in-phase digital signal and producing a filtered digital signal; and a first digital-to-analog converter for converting the filtered digital signal into a first analog signal. The apparatus also can include a baseband signal generator, for producing an AM baseband signal; a first summer for summing the first analog and AM baseband signals to produce a composite analog signal; and a first modulator for modulating the composite analog signal with a first carrier signal at a transmission frequency, thus producing a first modulated signal.

To provide the quadrature component of the broadcast waveform, the apparatus also includes a quadrature digital signal generator producing a quadrature digital signal; a second digital-to-analog converter for converting the quadrature digital to a second analog signal; a second modulator for modulating the second analog signal with a second carrier signal, at the aforementioned transmission frequency and generally in quadrature with the first carrier signal, thus producing a second modulated signal; and a second summer for summing the first and second modulated signals, thus producing the broadcast waveform.

The apparatus can have a first low-pass filter between the first digital-to-analog converter and the first modulator, for receiving and filtering the composite analog signal, and a second low-pass filter between the second digital-to-analog converter and the second modulator, for receiving and filtering the second analog signal.

The high-pass filter can be an analog filter or a digital filter. If the high-pass filter precedes the first digital-to-analog converter in the signal flow, then the high-pass filter is a digital high-pass filter. On the other hand, if the high-pass filter is subsequent to the first digital-to-analog converter in the signal flow, then the high-pass filter is an analog high-pass filter. In general, the low-pass filters are located subsequent to the digital-to-analog converters, and are known as "reconstruction filters."

In an alternative embodiment of the apparatus, the quadrature component is produced in a manner similar to the previous embodiment. However, the in-phase component can be provided by using an in-phase digital signal generator to produce an in-phase digital signal which signal, in turn, can be provided to a high-pass filter to produce a filtered digital signal. A baseband signal generator can provide an AM baseband signal which then can be digitized in an analog-to-digital converter to produce a second digital signal. The second digital signal is added in a first summer to the filtered digital signal, producing a composite digital signal. A first digital-to-analog converter can convert the composite digital signal into a first analog signal. The first analog signal can be modulated in a first modulator with a first carrier signal at a transmission frequency to produce the first modulated signal, and added to the quadrature-signal-bearing second modulated signal in a second summer to produce the broadcast waveform. The second modulated signal can be generated in the manner set forth in the previous embodiment. That is, a quadrature digital signal produces a third digital signal which signal is converted into a second analog signal by a second analog-to-digital converter. A second modulator modulates the second analog signal with a second carrier signal at the transmission frequency, but generally in quadrature with the first carrier frequency to produce the second modulated signal.

The apparatus also can include a first low-pass filter between the first digital-to-analog converter and the first modulator, for receiving and filtering the first analog signal, and a second low pass filter between the second digital-to-analog converter and the second modulator, for receiving and filtering the second analog signal.

BRIEF DESCRIPTION OF THE DRAWINGS

FIG. 1 is a block diagram of an AM-DAB waveform generator that does not implement high-pass pre-filtering of the in-phase digital signal according to the invention herein.

FIGS. 2a and 2b are frequency spectra for in-phase and quadrature signals as produced by the waveform generator of FIG. 1.

FIGS. 4a and 4b are frequency spectra for in-phase and quadrature signals as produced by the AM-DAB waveform generator of FIG. 3.

DETAILED DESCRIPTION OF THE EMBODIMENTS

Figure 3:
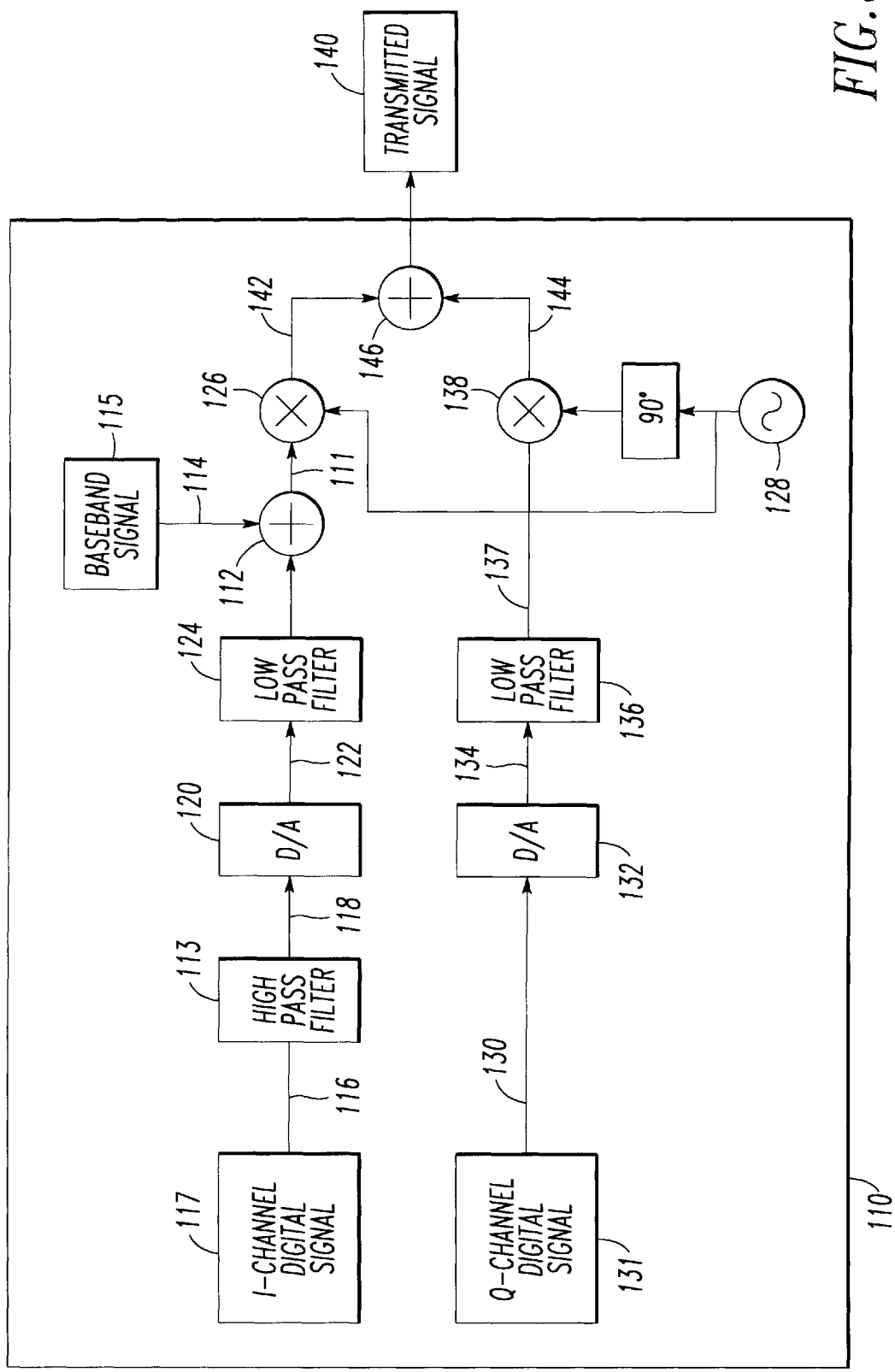
FIG. 3 is one embodiment of an AM-DAB waveform generator using high-pass prefiltering according to the invention herein.

FIG. 1 illustrates one current embodiment for an AM-DAB waveform generator 10 that lacks high-pass prefiltering of the I-channel digital signal stream. In general, I-channel signal 16 can be received from I-channel digital signal generator 17 by digital-to-analog converter 20 to provide in-phase baseband signal 22. Reconstruction low-pass filter 24 can be used to reduce noise prior to summation of filtered in-phase baseband signal 25 in summer 12 with AM baseband signal 14 from baseband signal generator 15. Signal 14 can be music, voice, and the like. Summer output 18 is shifted in frequency using mixer 26, with the modulation frequency being supplied by local oscillator 28. In general, the modulation frequency is the AM carrier transmission frequency. Q-channel digital signal 30 can be provided by Q-channel digital signal generator 31 and be input to digital-to-analog converter 32 to provide quadrature baseband signal 34. Similar to in-phase baseband signal 22, signal 34 can be processed by reconstruction low-pass filter 36 to reduce noise prior to modulation in quadrature mixer 38. Mixer 38 is provided the modulation frequency by local oscillator 28; however, the signal provided to mixer 38 is shifted in phase by 90 degrees, i.e. is in quadrature, relative to the signal provided to mixer 26. Transmitted signal output 40 thus can be produced by summing in-phase modulated signal 42 and quadrature modulated signal 44.

FIGS. 2a and 2b illustrate the in-phase and quadrature spectra, respectively, that may be created by generator 10 in FIG. 1. In each of FIGS. 2a and 2b, and FIGS. 4a and 4b, the horizontal axis is representative of transmitted signal frequency and the vertical axis is representative of signal magnitude. In FIG. 2a, spectra 100a, 100b represent the lower and upper I-channel digital signal spectra, respectively. Spectrum 102 represents the frequency spectrum of the conventional AM signal. In FIG. 2a, sidelobes 104a, 104b of spectra 100a, 100b overlap frequency spectrum 102 of the AM baseband signal, thus adding to distortion of the signal recovered by the AM receiver.

In FIG. 2b, Q-channel spectrum 106 overlaps the frequency range of spectrum 102 in FIG. 2a. However, the Q-channel signal can be separated from the I-channel signal because they are in quadrature.

FIG. 3 shows one embodiment of the present invention with AM DAB waveform generator 110, using high-pass prefiltering of I-channel digital signal 116 in which the I-channel digital signal can be filtered before it is added to the conventional AM baseband signal. To accomplish prefiltering, I-channel digital signal generator 117 sends signal 116 to digital high-pass filter 113 before discrete-time-to-continuous-time signal conversion of output 118 by digital-to-analog converter 120. Filter 113 can have a steep frequency roll-off, for example, at least 40 dB/decade. Furthermore, it is preferred that filter 113 have an approximately linear phase response to reduce possible distortion of signal 116. Generally, it is preferred that signal 116 receive high-pass filtering before signal 116 is added with AM baseband signal 114.

Typically, the frequency range of in-phase signal 116 does not overlap with AM baseband signal 114. However, the sidelobes of in-phase signal 116 may spill over into the frequency region occupied by signal 114, thereby causing interference with signal 114. By using high-pass filter 113 to filter in-phase digital signal 116, the overlapping sidelobes are substantially attenuated, and interference with AM baseband signal 114 thereby is reduced.

One embodiment of filter 113 can be implemented using two cascaded infinite-impulse-response (IIR) filters, with one having the time-reversed, conjugated impulse response of the other. In general, the above implementation using cascaded IIR filters would have linear phase with about twice the selectivity, in dB, of a single IIR filter, and would tend to require a smaller computational load than would an FIR filter providing similar selectivity.

After prefiltering, signal 122 then can be filtered by reconstruction low-pass filter 124. Conventional AM baseband analog signal 114 can be produced by baseband signal generator 115 and can be added to filter 124 output in summer 112 to produce composite in-phase analog signal 111. Signal 111 can be modulated in mixer 126 using the carrier frequency supplied by local oscillator 128 to produce in-phase modulated signal 142. This modulation frequency is typically equal to the desired AM carrier RF transmission frequency.

Similar to FIG. 1, Q-channel digital signal 130 which is produced by signal generator 131 can be converted to quadrature baseband signal 134 by digital-to-analog converter 132, which signal 134 then can be processed by reconstruction low-pass filter 136 to produce filtered quadrature signal 137. Signal 137 then can be modulated in quadrature mixer 138 to produce modulated quadrature signal 144. Signals 142 and 144 can be added in summer 146 to produce transmitted signal output 140, which is the broadcast waveform.

A method for using AM DAB waveform generator 110 for generating a broadcast waveform, then, can include generating an in-phase digital signal; filtering the in-phase digital signal with a high-pass filter, thus producing a filtered digital signal; converting the filtered digital signal to a first analog signal; generating an AM baseband signal, and summing the first analog signal with the AM baseband signal, thus producing a composite analog signal; modulating the composite analog signal onto a first carrier signal at a transmission frequency and producing a first modulated signal.

The method continues by generating a quadrature digital signal; converting the quadrature digital signal to a second analog signal; modulating the second analog signal onto a second carrier signal at the transmission frequency, and producing a second modulated signal thereby; then, combining the first and second modulated signals to produce the broadcast waveform. The second carrier signal frequency is equal to the first carrier signal frequency, but shifted in phase by about 90 degrees. The method also can include filtering the first and second analog signals using first and second low-pass filters, respectively.

FIG. 4a illustrates the reduction in the overlap of in-phase digital signal spectra 200a, 200b with analog signal spectrum 202 that may result from AM DAB waveform generator 110 in FIG. 3. Sidelobes 204a, 204b of spectra 200a, 200b, respectively, are attenuated to be substantially below the 0 dBc reference signal amplitude level. Similar to spectrum 106 in FIG. 2b, frequency spectrum 206 in FIG. 4b overlaps the spectra 200a, 200b in FIG. 4a. As discussed in FIG. 2b, because the Q-channel digital signal is in quadrature with the I-channel signal, the Q-channel signal can be separated from the I-channel signal by the receiver.

Figure 5:
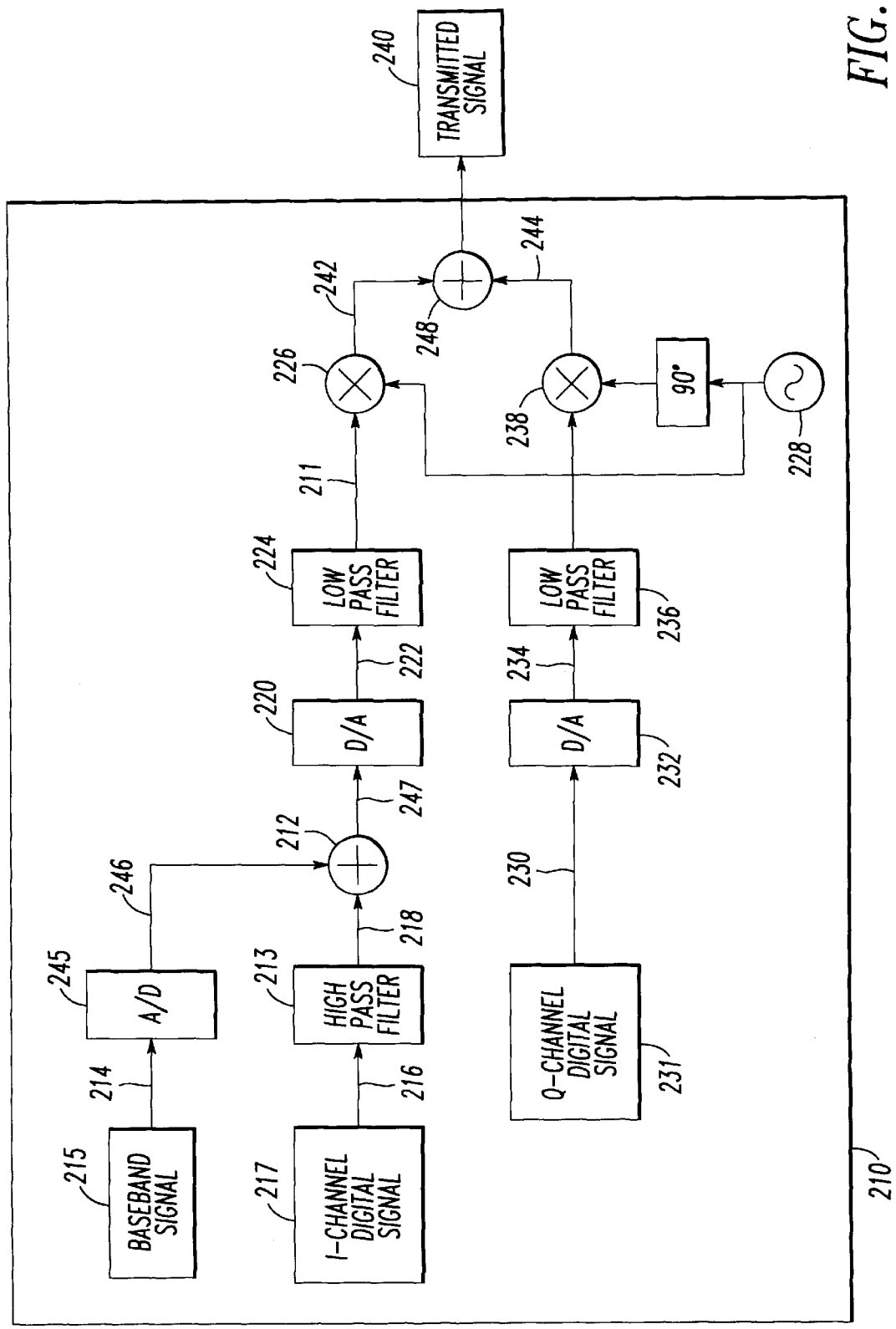
FIG. 5 is another embodiment of an AM-DAB waveform generator using high-pass prefiltering according to the invention herein.

FIG. 5 presents another embodiment of DAB waveform generator 210 using high-pass prefiltering of I-channel digital signal 216. To accomplish prefiltering, I-channel digital signal generator 217 sends signal 216 to high-pass filter 213, producing filtered output 218. Filter 213 can be a digital filter having a steep frequency roll-off, for example, at least 40 dB/decade, and can be similar to filter 113 in FIG. 3. The conventional AM baseband output 214 of signal generator 215 can be digitized in analog-to-digital converter 245 to produce digital output 246. Baseband signal 214 can be a digital signal if signal 214 is derived from a digital source, for instance, if signal generator 215 is a compact disc player having digital outputs. In this case, analog-to-digital converter 245 would be replaced by a digital rate converter with suitable post-filtering.

Digital output 246 can be added with filtered output 218 in summer 212 to produce composite digital signal 247. Signal 247 can be converted to a continuous-time signal in digital-to-analog converter 220, thus producing analog composite signal 222. Reconstruction filtering can be performed by low-pass filter 224, resulting in filtered analog signal 211. Signal 211 can then be modulated in modulator 226 using local oscillator 228 to produce in-phase modulated signal 242. The first modulator or carrier frequency typically is the AM carrier RF transmission frequency.

Similar to FIG. 3, Q-channel digital signal 230 in FIG. 5 is produced by Q-channel digital signal generator 231 and can be converted to analog quadrature baseband signal 234 by digital-to-analog converter 232, which signal 234 can be processed by reconstruction low-pass filter 236 to reduce noise. Signal 234 then can be modulated in quadrature mixer 238 to produce modulated quadrature signal 244. The second modulation, or carrier frequency, typically is the AM carrier RF transmission frequency. However, the second carrier signal usually is in quadrature with, i.e. shifted 90 degrees in phase from, the first carrier signal. Signals 242 and 244 can be added in summer 248 to generate transmitted signal output 240, which is the broadcast waveform.

A method for using AM DAB waveform generator 210 in FIG. 5 for generating a broadcast waveform, then, can include generating an in-phase digital signal; filtering the in-phase digital signal with a first filter, thus producing a filtered digital signal; generating an AM baseband signal, and converting the AM baseband signal to a second digital signal; summing the filtered digital signal and the second digital signal to produce a composite digital signal; converting the composite digital signal to a composite analog signal; and modulating the composite analog signal onto a first carrier signal at a transmission frequency to produce a first modulated signal.

This method also includes generating a quadrature digital signal; converting the quadrature digital signal to a first analog signal; modulating the first analog signal onto a second carrier signal at the same transmission frequency, but shifted in phase by 90 degrees with respect to the first carrier signal, to produce a second modulated signal; and combining the first modulated signal with the second modulated signal, thus producing the broadcast waveform. The method can further include filtering the composite and analog signals using first and second low-pass filters, respectively.

Figure 6:
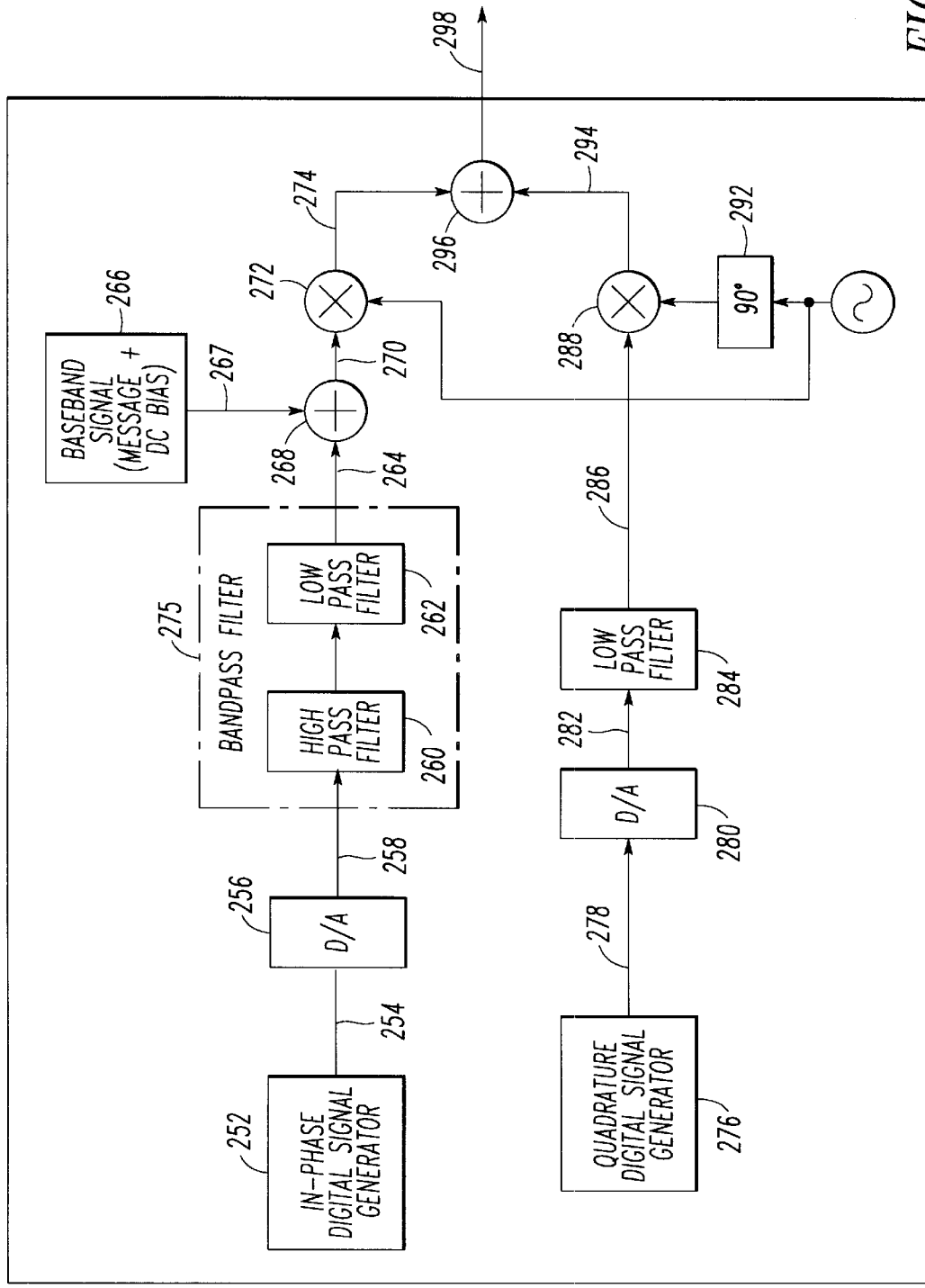
FIG. 6 is yet another embodiment of an AM-DAB waveform generator using high-pass prefiltering according to the invention herein.

In FIG. 6, another embodiment of AM DAB waveform generator 250 is illustrated, where in-phase digital signal generator 252 produces in-phase digital signal 254. Signal 254 can be converted by digital-to-analog converter 256 to first analog signal 258 which is received and filtered by high-pass filter 260 and, then, by reconstruction low-pass filter 262, producing in-phase filtered signal 264. Baseband signal generator 266 produces AM baseband signal 267 which can include the message signal with an added DC bias. The added DC bias produces the AM carrier component of the broadcast waveform. Signals 264 and 267 can be summed in summer 268 to produce composite analog signal 270. Signal 270 can be shifted in frequency to a first carrier frequency in modulator 272 using local oscillator 290, producing first modulated signal 274. The positioning of high-pass filter 260 and low-pass filter 262 in the signal flow can be reversed such that low-pass filter 262 precedes filter 260 in the signal flow. Furthermore, the functions of filters 260 and 262 may be combined to produce band-pass filter 275.

Quadrature signal generator 276 produces quadrature digital signal 278 which is converted to second analog signal 282 by digital-to-analog converter 280, which signal 282 can be processed by low-pass filter 284, producing quadrature filtered signal 286. Signal 286 is shifted to the modulation, or carrier, frequency by modulator 288, thus producing second modulated signal 294. Signals 274 and 294 can be summed in summer 296 to produce broadcast signal 298.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the invention which is to be given the full breadth of the following claims and any and all embodiments thereof.

We claim:

1. An apparatus for generating an AM-compatible digital broadcast waveform, comprising:

(a) an in-phase digital signal generator producing an in-phase digital signal;

(b) a high-pass filter connected to said in-phase digital signal generator for filtering said in-phase digital signal, producing a filtered digital signal thereby;

(c) a first digital-to-analog converter connected to said high-pass filter, said converter converting said filtered digital signal into a first analog signal;

(d) a baseband signal generator producing an AM baseband signal;

(e) a first summer operably connected to said first digital-to-analog converter and said baseband signal generator, said summer summing said first analog signal and said AM baseband signal producing a composite analog signal thereby;

(f) a first modulator for modulating said composite analog signal with a first carrier signal having a transmission frequency producing a first modulated signal thereby;

(g) a quadrature digital signal generator producing a quadrature digital signal;

(h) a second digital-to-analog converter connected to said quadrature digital signal generator, said converter converting said quadrature digital signal into a second analog signal;

(i) a second modulator for modulating said second analog signal with a second carrier signal having said transmission frequency producing a second modulated signal thereby, said second carrier signal being generally in quadrature with said first carrier signal; and (j) a second summer for summing said first modulated signal and said second modulated signal, producing said broadcast waveform thereby.

2. The apparatus of claim 1 further comprising:
(a) a first low-pass filter operably interposed between said first digital-to-analog converter and said first modulator, said first low-pass filter for receiving and filtering one of said composite analog signal and said first analog signal; and
(b) a second low-pass filter operably interposed between said second digital-to-analog converter and said second modulator, said second low-pass filter for receiving and filtering said second analog signal.

3. The apparatus of claim 1 wherein said high-pass filter is a finite-impulse-response filter having a predetermined frequency roll-off.

4. The apparatus of claim 1 wherein said high-pass filter is at least one infinite-impulse-response filter having a predetermined frequency roll-off.

5. The apparatus of claim 4 wherein said infinite impulse response filter is a cascaded infinite-impulse-response filter.

6. The apparatus of claim 5 further comprising a pair of infinite-impulse-response filters wherein one of said pair has a time-reversed, conjugated impulse response respective of the other of said pair.

7. The apparatus of claim 3 wherein said predetermined frequency roll-off is at least 40 dB/decade.

8. The apparatus of claim 4 wherein said predetermined frequency roll-off is at least 40 dB/decade.

9. An apparatus for generating an AM-compatible digital broadcast waveform, comprising:
(a) an in-phase digital signal generator producing an in-phase digital signal;
(b) a high-pass filter connected to said in-phase digital signal generator for filtering said in-phase digital signal, producing a filtered digital signal thereby;
(c) a baseband signal generator producing an AM baseband signal;
(d) an analog-to-digital converter connected to said AM baseband signal generator for converting said baseband signal into a second digital signal;
(e) a first summer operably connected to said analog-to-digital converter and said first filter, said summer summing said in-phase digital signal and said second digital signal, producing a composite digital signal thereby;
(f) a first digital-to-analog converter connected to said first summer, said converter converting said composite digital signal into a first analog signal;
(g) a first modulator for modulating said first analog signal with a first carrier signal having a transmission frequency producing a first modulated signal thereby;
(h) a quadrature digital signal generator producing a third digital signal;
(i) a second digital-to-analog converter connected to said quadrature digital signal generator, said converter converting said third digital signal into a second analog signal;
(j) a second modulator for modulating said second analog signal with a second carrier signal having said transmission frequency, and producing a second modulated signal thereby, said second carrier signal being generally in quadrature with said first carrier signal; and
(k) a second summer for summing said first modulated signal and said second modulated signal, producing said broadcast waveform thereby.

10. The apparatus of claim 9 further comprising:
(a) a first low-pass filter operably interposed between said first digital-to-analog converter and said first modulator, said first low-pass filter for receiving and filtering said first analog signal; and
(b) a second low-pass filter operably interposed between said second digital-to-analog converter and said second modulator, said second low-pass filter for receiving and filtering said second analog signal.

11. The apparatus of claim 9 wherein said high-pass filter has a predetermined frequency roll-off.

12. The apparatus of claim 11 wherein said predetermined frequency roll-off is at least 40 dB/decade.

13. The apparatus of claim 11 wherein said high-pass filter is a finite-impulse-response filter.

14. The apparatus of claim 11 wherein said high-pass filter is at least one infinite-impulse-response filter.

15. The apparatus of claim 14 wherein said high-pass filter is a cascaded infinite-impulse-response filter.

16. The apparatus of claim 15 further comprising a pair of infinite-impulse-response filters wherein one of said pair has a time-reversed, conjugated impulse response respective of the other of said pair.

17. A method for generating an AM-compatible digital broadcast waveform, comprising the steps of:
(a) generating an in-phase digital signal;
(b) filtering said in-phase digital signal with a high-pass filter, producing a filtered digital signal thereby;
(c) converting said filtered digital signal to a first analog signal;
(d) generating an AM baseband signal;
(e) summing said first analog signal and said baseband AM signal producing a composite analog signal thereby;
(f) modulating said composite analog signal onto a first carrier signal having a transmission frequency, producing a first modulated signal thereby;
(g) generating a quadrature digital signal;
(h) converting said quadrature digital signal to a second analog signal;
(i) modulating said second analog signal onto a second carrier signal having said transmission frequency, producing a second modulated signal thereby, said second carrier signal being generally in quadrature with said first carrier signal; and
(j) combining said first modulated signal with said second modulated signal, producing said broadcast waveform thereby.

18. The method of claim 17 further comprising the steps of:
(a) filtering said first analog signal using a first low-pass filter; and
(b) filtering said second analog signal using a second low-pass filter.

19. The method of claim 17 wherein said high-pass filter is a finite-impulse-response filter having a predetermined frequency roll-off.

20. The method of claim 17 wherein said high-pass filter is an infinite-impulse-response filter having a predetermined frequency roll-off.

21. The method of claim 20 wherein said high-pass filter is a cascaded infinite-impulse-response filter.

22. The method of claim 21 further comprising a pair of infinite-impulse-response filters wherein one of said pair has a time-reversed, conjugated impulse response respective of the other of said pair.

23. The method of claim 19 wherein said predetermined frequency roll-off is at least 40 dB/decade.

24. The method of claim 20 wherein said predetermined frequency roll-off is at least 40 dB/decade.

25. A method for generating an AM-compatible digital broadcast waveform, comprising the steps of:
(a) generating an in-phase digital signal;
(b) filtering said in-phase digital signal with a high-pass filter, producing a filtered digital signal thereby;
(c) generating an AM baseband signal;
(d) converting said AM baseband signal to a second digital signal;
(e) summing said filtered digital signal and said second digital signal, producing a composite digital signal thereby;
(f) converting said composite digital signal to a composite analog signal;
(g) modulating said composite analog signal onto a first carrier signal having a transmission frequency, producing a first modulated signal thereby;
(h) generating a quadrature digital signal;
(i) converting said quadrature digital signal to a second analog signal;
(j) modulating said second analog signal onto a second carrier signal having said transmission frequency, producing a second modulated signal thereby, said second carrier signal being generally in quadrature with said first carrier signal; and
(k) summing said first modulated signal with said second modulated signal, producing said broadcast waveform thereby.

26. The method of claim 25 further comprising the steps of:
(a) filtering said composite analog signal using a first low-pass filter; and
(b) filtering said second analog signal using a second low-pass filter.

27. The method of claim 25 wherein said high-pass filter has a predetermined frequency roll-off.

28. The method of claim 27 wherein said predetermined frequency roll-off is at least 40 dB/decade.

29. The method of claim 27 wherein said high-pass filter is a finite-impulse-response filter.

30. The method of claim 27 wherein said high-pass filter is at least one infinite-impulse-response filter.

31. The method of claim 30 wherein said high-pass filter is a cascaded infinite-impulse-response filter.

32. The method of claim 31 further comprising a pair of infinite-impulse-response filters wherein one of said pair has a time-reversed, conjugated impulse response respective of the other of said pair.

33. An apparatus for generating an AM-compatible digital broadcast waveform, comprising:
(a) an in-phase digital signal generator producing an in-phase digital signal;
(b) a first digital-to-analog converter connected to said in-phase digital signal generator, said converter converting said in-phase digital signal to a first analog signal;
(c) a first filter connected to said first analog-to-digital converter for filtering said first analog signal, producing a first filtered signal thereby;
(d) a second filter connected to said first filter, said second filter filtering said first filtered signal to produce a second filtered signal;
(e) a baseband signal generator producing an AM baseband signal;
(f) a first summer connected to said second filter and said baseband signal generator for summing said second filtered signal and said AM baseband signal to produce a composite analog signal thereby;
(g) a first modulator for modulating said composite analog signal with a first carrier signal having a transmission frequency producing a first modulated signal thereby;
(h) a quadrature digital signal generator producing a quadrature digital signal;
(i) a second digital-to-analog converter connected to said quadrature digital signal generator, said converter converting said quadrature digital signal into a first analog signal;
(j) a low-pass filter connected to said second digital-to-analog converter for filtering said first analog signal and producing a third filtered signal;
(k) a second modulator for modulating said third filtered signal with a second carrier signal having said transmission frequency producing a second modulated signal thereby, said second carrier signal being generated in quadrature with said first carrier signal; and
(l) a second summer for summing said first modulated signal and said second modulated signal, producing said broadcast waveform thereby.

34. The apparatus of claim 33 wherein one of said first and second filters is a high-pass filter and the other of said first and second filters is a second low-pass filter, said high-pass filter having a predetermined frequency roll-off.

35. The apparatus of claim 34 wherein said predetermined frequency roll-off is at least 40 dB/decade.

36. The apparatus of claim 34 wherein said high-pass filter and said second low-pass filter are combined to form a band-pass filter.

37. The apparatus of claim 34 wherein said first summer is provided between said high-pass filter and said second low-pass filter.

38. A method for generating an AM-compatible digital broadcast waveform, comprising the steps of:
(a) generating an in-phase digital signal;
(b) converting said in-phase digital signal to a first analog signal;
(c) filtering said first analog signal to produce a first filtered signal;
(d) filtering said first filtered signal to produce a second filtered signal;
(e) producing an AM baseband signal;
(f) summing said second filtered signal and said AM baseband signal to produce a composite analog signal;
(g) modulating said composite analog signal with a first carrier signal having a transmission frequency to produce a first modulated signal;
(h) producing a quadrature digital signal;
(i) converting said quadrature digital signal into a first analog signal;
(j) filtering said first analog signal with a low-pass filter to produce a third filtered signal;
(k) modulating said third filtered signal with a second carrier signal having said transmission frequency to produce a second modulated signal, said second carrier signal being generated in quadrature with said first carrier signal; and
(l) summing said first modulated signal and said second modulated signal to produce said broadcast waveform.

39. The method of claim 38 further comprising the steps of:
(a) filtering said first analog signal using a high-pass filter having a predetermined frequency roll-off; and
(b) filtering said filtered signal using a low-pass filter.

40. The method of claim 39 wherein said predetermined frequency roll-off is at least 40 dB/decade.

41. An apparatus for generating an AM-compatible digital broadcast waveform, comprising:
(a) an in-phase digital signal generator producing an in-phase digital signal;
(b) a first digital-to-analog converter connected to said in-phase digital signal generator, said converter converting said in-phase digital signal into a first analog signal;
(c) a baseband signal generator producing an AM baseband signal;
(d) a first summer operably connected to said first digital-to-analog converter and said baseband signal generator, said summer summing said first analog signal and said AM baseband signal producing a composite analog signal thereby;
(e) a first modulator for modulating said composite analog signal with a first carrier signal having a transmission frequency producing a first modulated signal thereby;
(f) a quadrature digital signal generator producing a quadrature digital signal;
(g) a second digital-to-analog converter connected to said quadrature digital signal generator, said converter converting said quadrature digital signal into a second analog signal;
(h) a second modulator for modulating said second analog signal with a second carrier signal having said transmission frequency producing a second modulated signal thereby, said second carrier signal being generally in quadrature with said first carrier signal; and
(i) a second summer for summing said first modulated signal and said second modulated signal, producing said broadcast waveform thereby.

42. A method for generating an AM-compatible digital broadcast waveform, comprising the steps of:
(a) generating an in-phase digital signal;
(b) converting said in-phase digital signal to a first analog signal;
(c) generating an AM baseband signal;
(d) summing said first analog signal and said baseband AM signal producing a composite analog signal thereby;
(e) modulating said composite analog signal onto a first carrier signal having a transmission frequency, producing a first modulated signal thereby;
(f) generating a quadrature digital signal;
(g) converting said quadrature digital signal to a second analog signal;
(h) modulating said second analog signal onto a second carrier signal having said transmission frequency, producing a second modulated signal thereby, said second carrier signal being generally in quadrature with said first carrier signal; and
(i) combining said first modulated signal with said second modulated signal, producing said broadcast waveform thereby.

* * * * *